(12) United States Patent
Badie

(10) Patent No.: US 10,938,341 B2
(45) Date of Patent: Mar. 2, 2021

(54) APPARATUS AND SYSTEM FOR DETECTING PHOTOVOLTAIC HEALTH AND QUALITY IN SOLAR PANELS

(71) Applicant: Thales Defense & Security, Inc., Clarksburg, MD (US)

(72) Inventor: Mehrdad Badie, Gaithersburg, MD (US)

(73) Assignee: THALES DEFENSE & SECURITY, INC., Clarksburg, MD (US)

( * ) Notice: Subject to any disclaimer, the term of this patent is extended or adjusted under 35 U.S.C. 154(b) by 358 days.

(21) Appl. No.: 15/818,250

(22) Filed: Nov. 20, 2017

(65) Prior Publication Data

US 2018/0175791 A1   Jun. 21, 2018

Related U.S. Application Data

(60) Provisional application No. 62/424,919, filed on Nov. 21, 2016.

(51) Int. Cl.
| | | |
|---|---|---|
| *G01R 27/02* | (2006.01) | |
| *G01R 25/00* | (2006.01) | |
| *H02S 50/10* | (2014.01) | |
| *H02S 10/40* | (2014.01) | |
| *H02S 40/30* | (2014.01) | |
| *H02S 30/20* | (2014.01) | |

(52) U.S. Cl.
CPC ............. *H02S 50/10* (2014.12); *G01R 27/02* (2013.01); *H02S 10/40* (2014.12); *H02S 30/20* (2014.12); *H02S 40/30* (2014.12)

(58) Field of Classification Search
CPC .......... H02S 50/10; H02S 10/40; H02S 30/20; H02S 40/36; H02S 20/30; G01R 27/02; G01R 25/00
See application file for complete search history.

(56) References Cited

U.S. PATENT DOCUMENTS 4,205,265 A  *  5/1980  Staebler .................. H02S 50/10
                                                              136/290
6,111,767 A      8/2000  Handleman
(Continued)

OTHER PUBLICATIONS

International Search Report and Written Opinion of related International Patent Application No. PCT/US2017/062737 dated Jan. 25, 2018.

*Primary Examiner* — Neel D Shah
(74) *Attorney, Agent, or Firm* — Arent Fox LLP

(57) ABSTRACT

A device that is attached to portable solar panels so as to allow users to readily verify panel quality and performance. In one example implementation, a device may perform a self-test by measuring the illuminated I-V (current-voltage) curve or dark I-V curve of the solar panel. The measured values derived from the self-test may be compared against a threshold to identify whether either the solar cells and/or the interconnects of the solar panel may have suffered damage affecting the performance of the portable solar panels. A user in the field may be able to dynamically determine whether the performance degradation is due to weather or setup conditions, or if the deviations are due to cell breakage, creases, and/or cracks on the solar cell or other comprised performance factors, such as compromised integrity of the system interconnect.

11 Claims, 6 Drawing Sheets

(56) References Cited

U.S. PATENT DOCUMENTS

| | | | | |
|---|---|---|---|---|
| 8,744,791 | B1* | 6/2014 | Kraft | H02S 50/00 |
| | | | | 702/65 |
| 10,461,690 | B2* | 10/2019 | Long | H01L 31/18 |
| 2010/0236035 | A1* | 9/2010 | Chung | H01L 31/18 |
| | | | | 29/25.01 |
| 2011/0273163 | A1* | 11/2011 | Jungerman | H02S 50/10 |
| | | | | 324/126 |
| 2012/0068729 | A1* | 3/2012 | Haslauer | H01L 31/076 |
| | | | | 324/761.01 |
| 2012/0313661 | A1* | 12/2012 | Jungwirth | G01N 21/9501 |
| | | | | 324/761.01 |
| 2013/0006556 | A1* | 1/2013 | Nishikawa | G01J 1/08 |
| | | | | 702/64 |
| 2013/0234645 | A1 | 9/2013 | Goei et al. | |
| 2015/0039270 | A1* | 2/2015 | Long | H02S 50/00 |
| | | | | 702/183 |
| 2015/0288319 | A1* | 10/2015 | Hartman | H02S 10/40 |
| | | | | 136/245 |

* cited by examiner

APPARATUS AND SYSTEM FOR DETECTING PHOTOVOLTAIC HEALTH AND QUALITY IN SOLAR PANELS

CROSS-REFERENCE TO RELATED APPLICATION(S)

This application claims benefit of U.S. Provisional Application Ser. No. 62/424,919, entitled "APPARATUS AND SYSTEM FOR DETECTING PHOTOVOLTAIC HEALTH AND QUALITY IN SOLAR PANELS" and filed Nov. 21, 2016, which is expressly incorporated by reference herein in its entirety.

FIELD

Aspects of the present disclosure relate to an apparatus and system for assessing energy source performance, and in particular to an apparatus and system for detecting performance health and quality of solar panel energy sources.

BACKGROUND

In recent years, as energy consumption costs have increased, consumers are turning to renewable energy sources in order to achieve budget stability. One such alternative energy source is photovoltaic solar cells that convert solar energy into electrical energy. The military, for example, has implemented aggressive plans that significantly expand on use of clean, renewable solar energy. Utilizing renewable solar energy may be especially beneficial over conventional fuels for missions that would otherwise require soldiers to carry fuel. Particularly, the added weight and quantity of fuel that may be required may hamper the military's ability to be agile in the field. Thus, utilizing solar energy as a power source for various applications may minimize resupply requirements for a range of military operations.

Generally, in order to meet the demands of the military, portable solar panels are deployed. In contrast to stationary and permanently installed solar panels that may be implemented in solar fields, the portable solar panels allow users in the field to easily carry the solar panels on missions to power applications such as communication radios and portable computers (e.g., laptops). Similarly, portable solar panels may be adopted in natural disaster areas where it may be difficult to transport fuel.

However, unlike solar panels that are implemented in solar fields, the portable and mobile solar panels absorb a lot of wear and tear that may damage one or more solar cells or interconnects. In some examples, damage to one or more solar cells and/or interconnects may not completely render the solar panel inoperative. The portable solar panels may suffer degradation of charge rate from original specifications that may be as much as fifty percent (50%) less than the ideal charge rate. Because a user (e.g., soldier carrying the portable solar panel) may not be aware of the degradation, the user may end up carrying the unnecessary weight of panels that may not be operating at ideal performance.

SUMMARY

Aspects of the present disclosure provide a device that is attached to the portable solar panels so as to allow users to readily verify panel quality and performance. In some examples, the term "attached" may refer to a device that is either embedded to the portable solar panels or coupled to the portable solar panels by detachable configuration. Particularly, in one example implementation, a device in accordance with aspects of the present disclosure may perform a self-test by measuring the illuminated I-V (current-voltage) curve or dark I-V curve of the solar panel, based on a trigger initiated signal received, for example, from the user or another triggering source. The measured values derived from the self-test may be compared against a threshold (e.g., deviation from ideal current and voltage at which the solar panel can be operated or loaded) to identify whether either the solar cells and/or the interconnects of the solar panel may have suffered damage affecting the performance of the portable solar panels. In some example implementations, the threshold may be specified by the user or based on the original/advertised specifications of the solar panels. As such, in accordance with aspects of the present disclosure, a user in the field may be able to dynamically determine (e.g., by pressing a button on the device) whether the performance degradation is due to weather or setup conditions (e.g., cloud cover or incorrect setup of the solar panels that may be preventing the solar panels from converting solar energy to electrical energy at the ideal rate), for example, or if the deviations are due to cell breakage, creases, and/or cracks on the solar cell or other comprised performance factors, such as compromised integrity of the system interconnects.

To the accomplishment of the foregoing and related ends, the one or more aspects comprise the features hereinafter fully described and particularly pointed out in the claims. The following description and the annexed drawings set forth in detail certain example features of the one or more aspects. These features are indicative, however, of but a few of the various ways in which the principles of various aspects may be employed, and this description is intended to include all such aspects and their equivalents.

BRIEF DESCRIPTION OF THE DRAWINGS

The disclosed aspects will hereinafter be described in conjunction with the appended drawings, provided to illustrate and not to limit the disclosed aspects, wherein like designations denote like elements, and in which.

DETAILED DESCRIPTION

Figure 1:
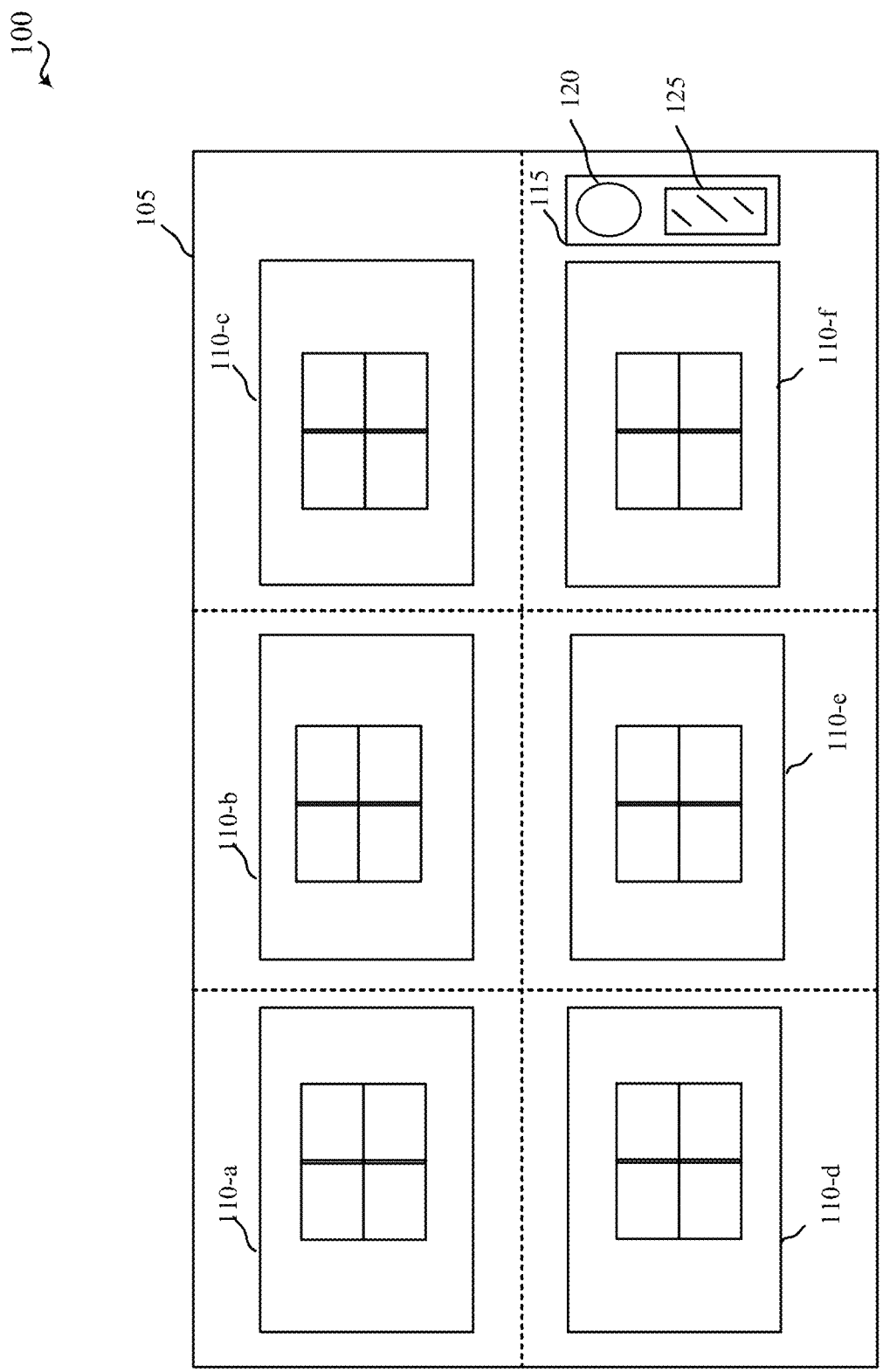
FIG. 1 illustrates an example of a portable folding solar panel having a monitoring device, in accordance with various aspects of the present disclosure.

As discussed above, due to wear and tear that is generally absorbed by portable solar panels, among other factors, such solar panels may suffer degradation of charge rate from original specifications. In some instances, the user of such a portable solar panel may not even be aware of the degradation or may not account for any degradation due to factors such as weather or improper setup. However, aspects of the present disclosure provide a device that is embedded into the construction of the portable solar panels that allows ready verification of panel quality and performance. For example, in one implementation of a device in accordance with aspects of the present disclosure, based on a trigger from the user, such device may perform a self-test by measuring the illuminated I-V curve or dark I-V curve of the solar panel. The measured values derived from the self-test may be compared against a threshold to identify whether either the solar cells and/or the interconnects of the solar panel have suffered damage affecting the performance of the portable solar panels, among other possible deterioration factors.

In some examples, features of the present disclosure may be implemented with portable solar panels exposed to sunlight, in which case the device will power itself from the solar power or using an onboard power cell (e.g., battery), without the need to unfold the solar panel and without the need to illuminate the panel. The device, in accordance with aspects of the present disclosure, also allows the checking/verification of solar panel quality and performance while the portable solar panel is still in the storage bag, for example when in an indoor environment. This capability may reduce or eliminate the need for controlled light excitation, which may only be available, for example, in a laboratory or manufacturing environment and not to the users of the panels in the field.

In some examples, various techniques in accordance with aspects of the present disclosure enable configuration of a device integrated with the portable solar panel to perform a self-test by measuring the illuminated I-V or "dark" or "no-light" I-V curve of the solar panel. In absence of light, the solar panel may be assessed for behavior using, for example, light from a diode. Thus, in some examples, the integrated device may measure the I-V characteristics of the solar panel to derive and/or use the parameters that define the quality and performance of the solar panel. In some examples, the key parameters defining quality and performance may include one or more of panel series resistance, shunt resistance, and/or the shape of the I-V curve near maximum power. In some examples, the information regarding shunt resistance may indicate the solar cell quality, while the series resistance value may identify issues with the interconnects. Any mismatch losses may signify cell damage. Thus, the information from the I-V curve of the portable solar panel may provide the monitoring device, for example, with a host of information that allows the monitoring device to make determination as to the suitability of the solar panels.

Various aspects are now described in more detail with reference to the FIGS. 1-5. In the following description, for purposes of explanation, numerous specific details are set forth in order to provide a thorough understanding of one or more aspects of the disclosure. It may be evident, however, that such aspect(s) may be practiced without these specific details. Additionally, the term "component" as used herein may be or include one of the parts that make up a system, and/or may be or include hardware, firmware, and/or software stored on a computer-readable medium, and may be divided into or utilized in one or more other components.

The following description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in other examples.

FIG. 1 illustrates an example of a solar panel system 100 having a solar panel monitoring device 115, in accordance with various aspects of the present disclosure. The portable folding solar panel 105 may be constructed so as to allow a user to "fold" the solar cells 110 various the creases (e.g., as shown in FIG. 1 as dashed lines). In a folded state, the portable folding solar panel 105 may occupy significantly less surface area than when the portable folding solar panel 105 is extended, as shown in FIG. 1.

The portable solar panel 105 may include one or more solar cells 110 interconnected to convert solar energy (e.g., when exposed to light, such as the sun or another illumination source) into electrical energy. The electrical energy may be used to power wide array of applications, such as communication radios, portable computers, etc. In some examples, the solar cells 110 may comprise photovoltaic cells. While the term "solar cell" may be used in the related art exclusively for cells that capture energy from the sunlight, the term as used herein encompasses both traditional solar cells and photovoltaic cells that may also convert other forms of light energy into electrical energy (e.g., such forms of light energy may not be limited to sunlight).

The portable solar panel 105 may further include a solar panel monitoring device 115 integrated with the portable solar panel 105 construction. The solar panel monitoring device 115 may include a trigger button 120 (e.g., mechanical push button) that when pressed or otherwise activated, may trigger the monitoring device 115 to perform a self-test on the portable solar panel 105 in order to detect possible performance degradation, such as flaws in the one or more solar cells 110 and/or the interconnects (not shown in FIG. 1) that may couple the plurality of solar cells in an array configuration.

In some examples, the display 125 is embedded in the solar panel monitoring device 115 such that the display 125 may display the results of the self-test (e.g., pass/fail and/or charge conversion rate). As such, a user may readily test the quality and performance of the solar cells and interconnects, among other possible performance degradation factors, while in the field without the need to connect the portable solar panel 105 to an external testing device in a laboratory, for example. In some aspects, the solar panel monitoring device 115 may be powered by the converted energy from the solar cells 110 and/or may include an internal power source (e.g., battery), for example. The internal power source may be beneficial, for example, when the portable solar panel 105 is being tested either indoors or in the folded state (e.g., in absence of light) by measuring the "dark I-V" curve. However, when exposed to sunlight or another light source, the solar panel monitoring device 115 may measure the I-V curve of the solar panels to identify the maximum power that is measured for the particular portable solar panel 105. The maximum power, for example, may be compared to one or more ideal or manufacturer specified maximum power information for the portable solar panel 105. For example, the solar panel monitoring device 110 may compare the measured maximum power of the portable solar panel 105 to the manufacturer specification for this measure. If the deviation or degradation of the measured maximum power is more than a predetermined threshold (e.g., allowable deviation), the solar panel monitoring device 110 may display a "FAIL" or other indicative status on the display 125. Alternatively, if the deviation or degradation of the measured maximum power is less than the predetermined threshold, the solar panel monitoring device 110 may display a "PASS" or other indicative status on the display 125.

Additionally or alternatively, the solar panel monitoring device 110 may display the measured energy conversion capability of the portable solar panel 105 so as to allow, for example, the user to recognize the level of degradation. Thus, by analyzing the I-V curve information, for example, that reflects energy conversion capability of the portable solar panel at a specified illumination and temperature conditions, performance assessment may be obtained. In some examples, the solar panel measuring device 115 may measure a photovoltaic (PV) module or string and compare the resulting I-V curve with one or more threshold or ideal PV models that may identify the maximum power point and/or other key parameters, and reveal performance issues that ordinary test instruments may not detect (e.g., cell breakage, creases and cracks or compromised integrity of the system interconnect).

As such, the techniques described herein may allow the user to test portable solar panels 105 in the field, prior to or after being deployed (e.g., while in storage). Such flexibility may prevent the user from unnecessarily carrying damaged solar panels that add weight to the user (e.g., soldier) that may otherwise be avoided.

Figure 2:
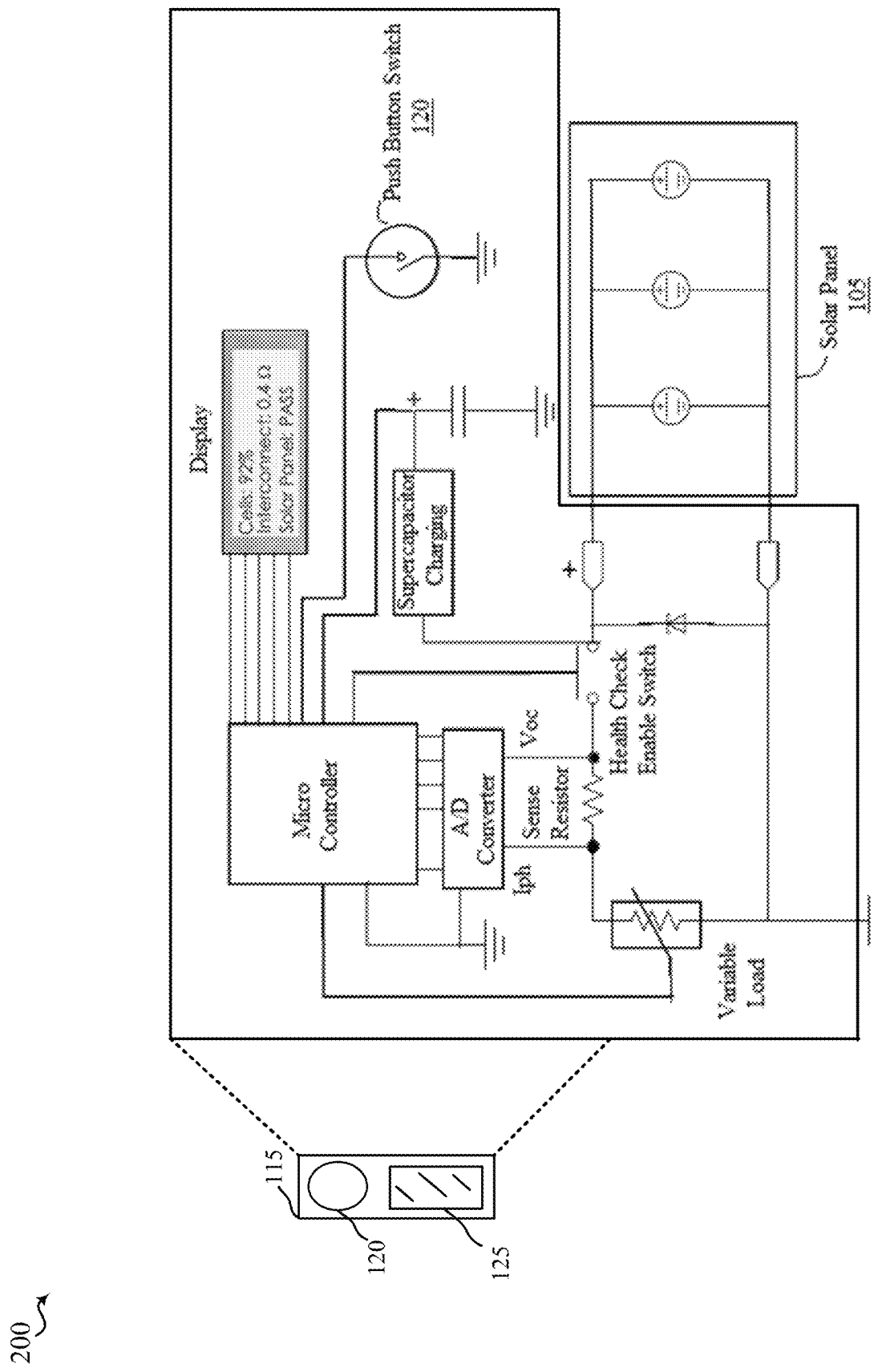
FIG. 2 illustrates an example hardware structure of a monitoring device integrated on a portable solar panel in accordance with various aspects of the present disclosure.
Figure 6:
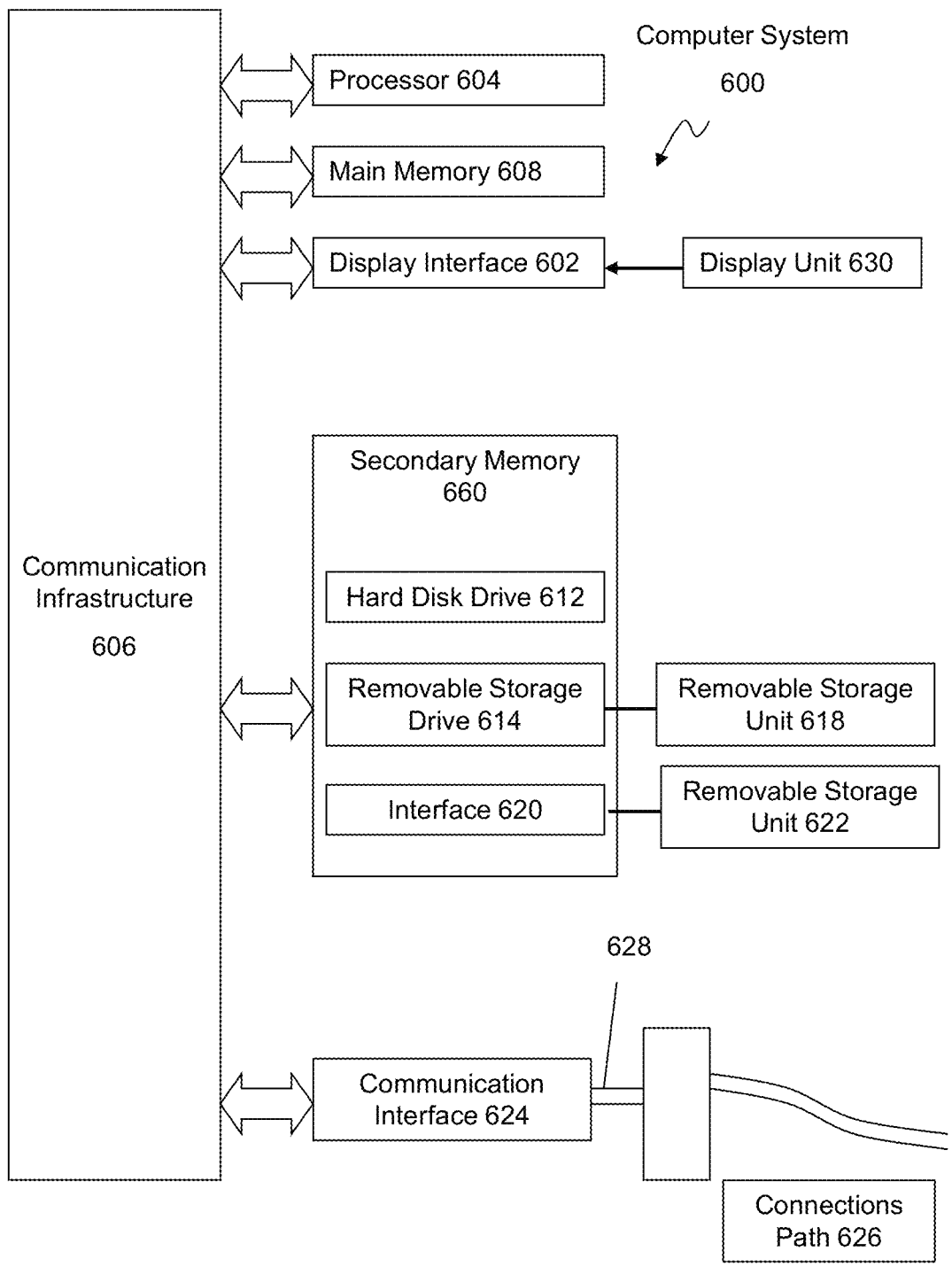
FIG. 6 contains a system diagram illustrating various example hardware components and other features, usable with or incorporation into various aspects of the present disclosure.

FIG. 2 illustrates an example hardware structure 200, such as the example solar panel monitoring device 115 of FIG. 1, integrated on a portable solar panel 105 in accordance with various aspects of the present disclosure. As shown in FIG. 2, the device 115 may include various hardware and/or software features for use in operation, including, for example, one or more processors 405 (See FIG. 4), such as a micro controller, one or more analog to digital (A/D) converter, one or more resistors and/or sources of fixed or variable load for circuitry included in the device 115, one or more switches, one or more diodes, and one or more charging related features, such as one or more supercapacitor charging components. Additional features of the device 115 may be included in or be incorporated into a terminal and/or a network that may optionally be utilized in conjunction with the device 115, as shown in FIG. 6, as shown and described further below. In some aspects, the microcontroller of the monitoring device 115 may be configured to measure the quality and performance of the solar panels 105. The solar panel monitoring device 115 may optionally be integrated into each portable solar panel. Accordingly, the monitoring device 115 may analyze, for example, I-V curve information to determine whether the solar cells or the interconnect have suffered damage. In some aspects, the display 125 may indicate, for example, whether the solar panel has passed or failed (and, for example, in some cases the corresponding percentage for) the self-test performed by the microcontroller.

Figure 3:
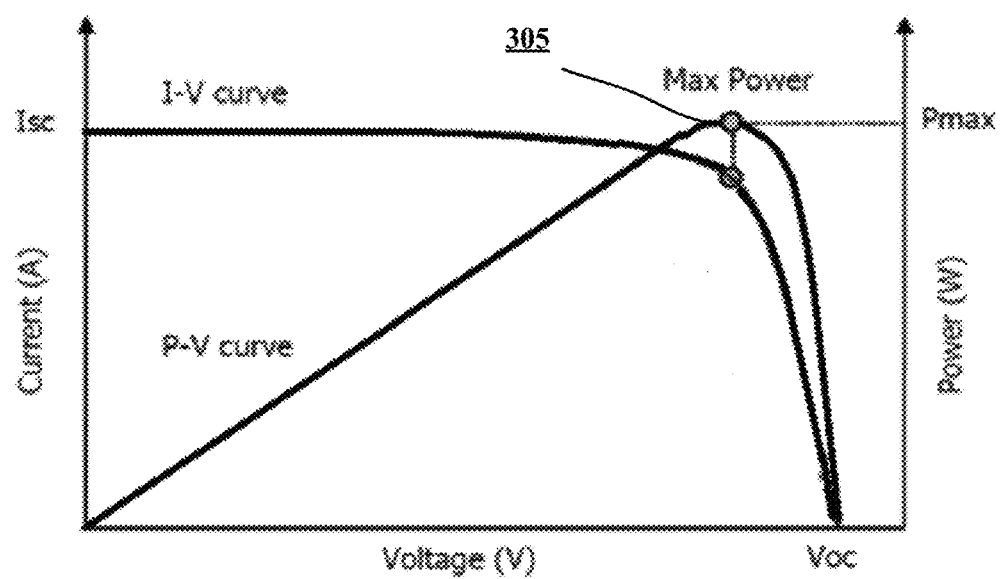
FIG. 3 is a I-V curve diagram illustrating an example of measured parameters by the monitoring device in accordance with various aspects of the present disclosure.

FIG. 3 contains an example I-V curve diagram 300 illustrating an example of measured parameters by the monitoring device in accordance with various aspects of the present disclosure. The solar panel measuring device 115 (FIGS. 1 and 2) may measure, for example, the quality and performance of the solar cells and system interconnects by analyzing an I-V curve information that reflects energy conversion capability of the portable solar panel at a specified illumination and temperature conditions. In some examples, the solar panel measuring device 115 may measure a PV module or string and compare the I-V curve of such PV module or string with the threshold or ideal PV models that identify the maximum power point and/or other key parameters, and by such comparison reveal performance issues that ordinary test instruments may not detect (e.g., cell breakage, creases and cracks or compromised integrity of the system interconnect).

The I-V curve of a PV string (or module) may describe the energy conversion capability of such PV string (or module) at the existing conditions of irradiance (light level) and temperature, for example. In some aspects, the I-V curve may represent the combinations of current and voltage at which the string could be operated or loaded, if the irradiance and cell temperature could be held constant. Diagram 300 shows an I-V curve, the power-voltage (P-V) curve that is computed from the I-V curve, and example key points on the curve. The I-V curve may range from the short circuit current (Isc) at zero volts, to zero current at the open circuit voltage (Voc), for example. At point 305 of the I-V curve may be the maximum power point (Imp, Vmp), the point at which the array generates maximum electrical power, for example. In an operating PV system, an inverter may adjust the load, identifying, for example, the particular point or a range on the I-V curve at which the solar panel array may yield the greatest DC power. In some aspects, fill factor of a PV module or string may be an important performance indicator. An impairment in the solar panel that reduces the fill factor may also reduce the output power by reducing Imp or Vmp or both. Thus, the solar panel measuring device 110 may analyze the I-V curve, for example, to identify the nature of the impairments. The effects of series losses, shunt losses, and mismatch losses on the I-V curve, for example, may indicate damage or impairment to the solar cells/interconnects.

Figure 4:
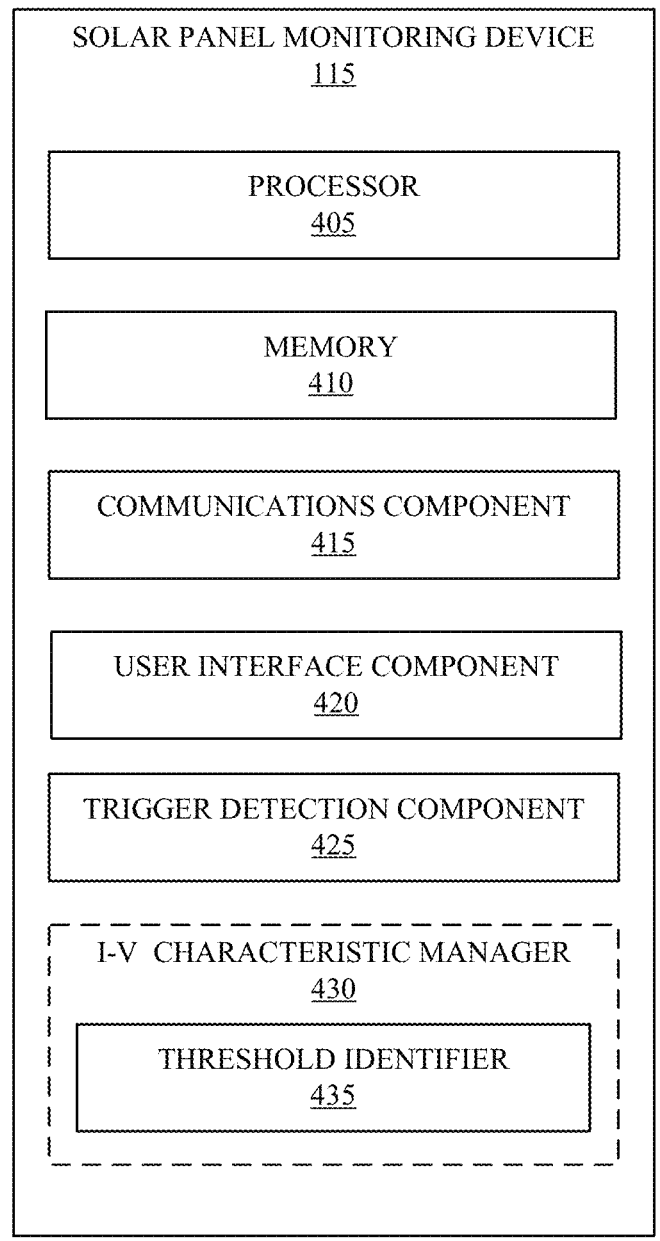
FIG. 4 is a block diagram illustrating an example of the monitoring device, in accordance with various aspects of the present disclosure.

Referring now to FIG. 4, a diagram illustrating various components of an example of a hardware implementation for a solar panel monitoring device 115 in accordance with various aspects of the present disclosure is described. In some examples, the solar panel monitoring device 115 may be similar to the monitoring device 115 described with reference to FIGS. 1 and 2, for example. Such components and/or portions or operations thereof may alternatively or further be carried out using various systems and network components as shown and described in conjunction with FIG. 6. In some examples, the solar panel monitoring device 115 may include a processor 405 for carrying out one or more processing functions (e.g., method 500 as shown and described in conjunction with FIG. 5) described herein. The processor 405 may include a single or multiple set of processors or multi-core processors. Moreover, the processor 405 can be implemented as an integrated processing system and/or a distributed processing system (see, e.g., FIG. 6 for example such features). In some examples, processor 405 may be an example of microcontroller described with reference to FIG. 2.

The solar panel monitoring device 115 may further include memory 410, such as for storing local versions of applications being executed by the processor 405. In some aspects, the memory 410 may be implemented as a single memory or partitioned memory. In some examples, the operations of the memory 410 may be managed by the processor 405. Memory 410 may include a type of memory usable by a computer, such as random access memory (RAM), read only memory (ROM), tapes, magnetic discs, optical discs, volatile memory, non-volatile memory, and any combination thereof. Additionally, the processor 405, and memory 410 may include and execute operating system (not shown).

Further, solar panel monitoring device 115 may include a communications component 415 that provides for establishing and maintaining communications with one or more parties utilizing hardware, software, and services as described herein. Communications component 415 may carry communications among various components on the solar panel monitoring device 115, as well as between the solar panel monitoring device 115 and external devices, such as solar cells or devices located across a communications network and/or devices serially or locally connected to solar panel monitoring device 115. For example, communications component 415 may include one or more buses, and may further include transmit chain components and receive chain components associated with a transmitter and receiver, respectively, operable for interfacing with external devices.

The solar panel monitoring device 115 may also include a user interface component 420 operable to receive inputs from a user of solar panel monitoring device 115 and further operable to generate outputs for presentation to the user. User interface component 420 may include one or more input devices, including but not limited to a touch-sensitive display, a navigation key, a function key, a microphone, a voice recognition component, and/or any other suitable mechanism capable of receiving an input from a user, or any combination thereof. Further, user interface component 420 may include one or more output devices, including but not limited to a display, a speaker, any other mechanism capable of presenting an output to a user, or any combination thereof. In some examples, the user interface component 420 may include a trigger button 120 and/or display 125, for example, as shown and described with reference to FIGS. 1 and 2.

The solar panel monitoring device 115 may further include a trigger detection component 425 for receiving indication of triggering of the operation of the device 115, such as may be received from the user interface component 420.

The solar panel monitoring device 115 may also include I-V characteristic manager 430 for measuring the illuminated I-V parameters and/or dark I-V parameters in order to identify the quality and performance (e.g., determine the quality of the solar cells and detect cell breakage, creases and cracks as well as the integrity of the system interconnect). The solar panel monitoring device 115 may further include a threshold identifier 435 configured to identify the allowable deviation from an acceptable/ideal current and voltage at which the solar panel can be operated or loaded), for example. As such, the solar panel monitoring device 115 may identify whether either the solar cells and/or the interconnects of the solar panel, for example, have suffered damage or other impacts affecting the performance of the portable solar panels. In some examples, the threshold may be specified by the user or based on the original/advertised specifications of the solar panels.

Figure 5:
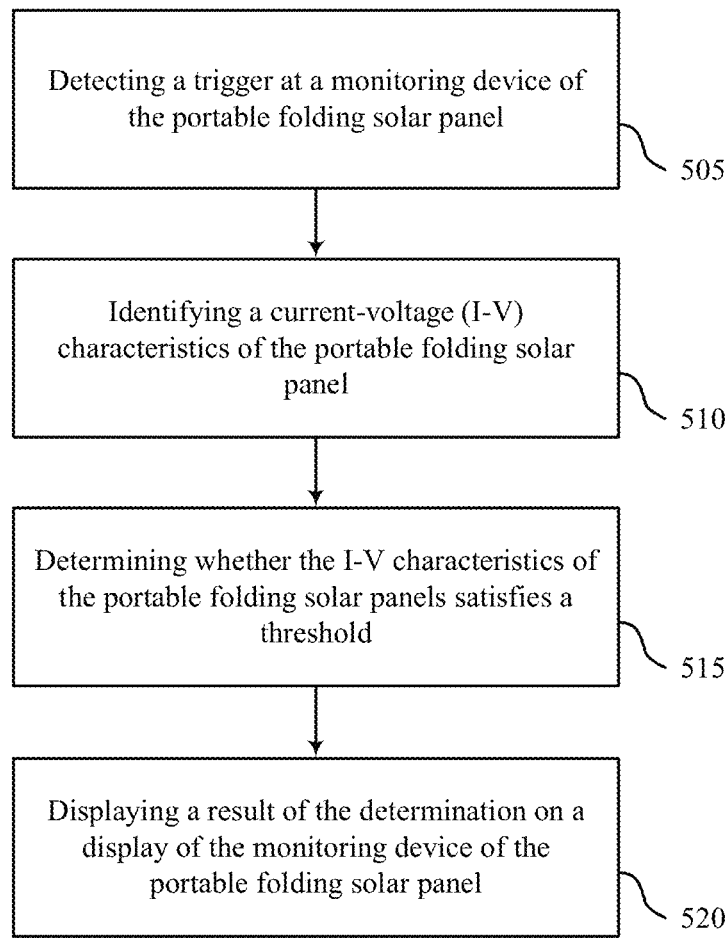
FIG. 5 is a flow chart illustrating an example method in accordance with various aspects of the present disclosure.

FIG. 5 illustrates a flow chart of an example method 500 for monitoring performance and quality of a portable solar panel in accordance with aspects of the present disclosure. The method 500 may be carried out, for example, for a monitoring device 115 (see, e.g., FIGS. 1-4) that may be embedded or attached to each portable solar panel. Although the method 500 is described below with respect to the elements of the monitoring device 115 (FIGS. 1-4), other components may be used to implement one or more of the steps described herein.

At block 505, the method may include detecting a trigger at a monitoring device of the portable solar panel. In some examples, the trigger may be user initiated (e.g., by user pressing the button 120 described with reference to FIG. 1. In other example implementations, the trigger may be or include a periodic trigger that is initiated at a predetermine time interval, for example. Aspects of block 505 may be performed by trigger detection component 425, for example, as shown and described with reference to FIG. 4.

At block 510, the method may include identifying an I-V characteristic of the portable solar panel. In some examples, the I-V characteristics may identify the energy conversion capability of the portable solar panel (e.g., converting solar energy into electrical energy) at a specified illumination and temperature conditions. In other examples, the device may measure the I-V characteristics either using illuminated I-V (e.g., in presence of light) or dark I-V curve (e.g., absence of light). Aspects of block 510 may be performed by I-V characteristic manager 430 as shown and described with reference to FIG. 4, for example.

At block 515, the method may include determining whether the I-V characteristic of the portable solar panels satisfies a threshold. In some example implementations, the threshold may be predefined or dynamically adjustable based on conditions for which the portable solar panel may be deployed. The threshold may identify the accepted deviation from the ideal energy conversion capability, for example, that is expected from a particular solar panel (e.g., based on manufacturer setting). Thus, as the level or amount of degradation in conversion capability increases due to, for example, damage (or internal flaws) of the solar cells and/or interconnectors, the monitoring device may be more likely to determine that the I-V characteristic fails (e.g., is greater) than the threshold. Thus, when the level of degradation exceeds the acceptable threshold amount, the monitoring device may indicate that the particular portable solar panel is damaged. Alternatively, when the level of degradation in conversion capability is decreased relative to the threshold, for example, the monitoring device may indicate that the solar panels have passed the self-test. Aspects of block 515 may be performed by combination of I-V characteristic manager 430 and/or threshold identifier 435, for example, as shown and described with respect to FIG. 4.

At block 520, the method may include displaying a result of the determination on a display of the monitoring device of the portable solar panel. In some examples, the display may identify a solar panel pass status when the I-V characteristic is less than the threshold, for example. Alternatively, when the measured I-V characteristics are greater than the threshold, the display 125 and/or user interface component 420 may display a fail status. Aspects of block 520 may be performed by the display 125 and/or user interface component 420, as shown and described with reference to FIGS. 1 and 4, for example.

Aspects of the present disclosure may be incorporated into and/or implemented using hardware, software or a combination thereof and may be implemented in one or more computer systems or other processing systems. In one variation, aspects of the present disclosure are directed toward one or more computer systems capable of carrying out the functionality described herein. An example of such a computer system 600 is shown in FIG. 6.

In FIG. 6, computer system 600 includes one or more processors, such as processor 604. For example, the processor 604 may be configured for carrying out various functions as shown and described in connection with FIGS. 1-5 above, for example. The processor 604 is connected to a communication infrastructure 606 (e.g., a communications bus, cross-over bar, or network). Various software aspects are described in terms of this example computer system. After reading this description, it will become apparent to a person skilled in the relevant art(s) how to implement the aspects presented herein using other computer systems and/or architectures.

Computer system 600 may include a display interface 602 that forwards graphics, text, and other data from the communication infrastructure 606 (or from a frame buffer not shown) for display on a display unit 630. Computer system 600 also includes a main memory 608, for example, random access memory (RAM), and may also include a secondary memory 660. The secondary memory 660 may include, for example, a hard disk drive 612 and/or a removable storage drive 614, representing a floppy disk drive, a magnetic tape drive, an optical disk drive, etc. The removable storage drive 614 may read from and/or writes to a removable storage unit 618 in a well-known manner. Removable storage unit 618, may represent, for example, a floppy disk, magnetic tape, optical disk, etc., which is read by and written to removable storage drive 614. As will be appreciated, the removable storage unit 618 may include a computer usable storage medium having stored therein computer software and/or data.

In alternative aspects, secondary memory 660 may include other similar devices for allowing computer programs or other instructions to be loaded into computer system 600. Such devices may include, for example, a removable storage unit 622 and an interface 620. Examples of such may include a program cartridge and cartridge interface (such as that found in video game devices), a removable memory chip (such as an erasable programmable read only memory (EPROM), or programmable read only memory (PROM)) and associated socket, and other removable storage units 622 and interfaces 620, which allow software and data to be transferred from the removable storage unit 622 to computer system 600.

Computer system 600 may also include a communications interface 624. Communications interface 624 allows software and data to be transferred between computer system 600 and external devices. Examples of communications interface 624 may include a modem, a network interface (such as an Ethernet card), a communications port, a Personal Computer Memory Card International Association (PCMCIA) slot and card, etc. Software and data transferred via communications interface 624 are in the form of signals 628, which may be electronic, electromagnetic, optical or other signals capable of being received by communications interface 624. These signals 628 are provided to communications interface 624 via a communications path (e.g., channel) 626. This path 626 carries signals 628 and may be implemented using wire or cable, fiber optics, a telephone line, a cellular link, wireless communications link, a radio frequency (RF) link and/or other communications channels. In this document, the terms "computer program medium", "computer-readable medium", and "computer usable medium" are used to refer generally to media such as a removable storage drive 614, a hard disk installed in hard disk drive 612, and signals 628. These computer program products provide software to the computer system 600. Aspects presented herein may include such computer program products.

Computer programs (also referred to as computer control logic) are stored in main memory 608 and/or secondary memory 610. Computer programs may also be received via communications interface 624. Such computer programs, when executed, enable the computer system 600 to perform the features presented herein, as discussed herein. In particular, the computer programs, when executed, enable the processor 604 to perform the features presented herein. Accordingly, such computer programs represent controllers of the computer system 600.

In aspects implemented using software, the software may be stored in a computer program product and loaded into computer system 600 using removable storage drive 614, hard disk drive 612, or communications interface 620. The control logic (software), when executed by the processor 604, causes the processor 604 to perform the functions as described herein. In another example, aspects may be implemented primarily in hardware using, for example, hardware components, such as application specific integrated circuits (ASICs). Implementation of the hardware state machine so as to perform the functions described herein will be apparent to persons skilled in the relevant art(s).

In yet another example, aspects presented herein may be implemented using a combination of both hardware and software. The functions described herein may be implemented in hardware, software executed by a processor, firmware, or any combination thereof. If implemented in software executed by a processor, the functions may be stored on or transmitted over as one or more instructions or code on a non-transitory computer-readable medium. Other examples and implementations are within the scope and spirit of the disclosure and appended claims. For example, due to the nature of software, functions described above can be implemented using software executed by a specially programmed processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C).

The previous description of the disclosure is provided to enable a person skilled in the art to make or use the disclosure. Various modifications to the disclosure will be readily apparent to those skilled in the art, and the common principles defined herein may be applied to other variations without departing from the spirit or scope of the disclosure. Furthermore, although elements of the described aspects and/or embodiments may be described or claimed in the singular, the plural is contemplated unless limitation to the singular is explicitly stated. Additionally, all or a portion of any aspect and/or embodiment may be utilized with all or a portion of any other aspect and/or embodiment, unless stated otherwise. Thus, the disclosure is not to be limited to the examples and designs described herein, and is to be accorded the widest scope consistent with the principles and novel features disclosed herein.

What is claimed is:

1. A method for monitoring performance of a portable solar panel, comprising:
    detecting a trigger at a monitoring device of the portable solar panel;
    identifying a current-voltage (I-V) characteristics of the portable solar panel;
    determining whether the I-V characteristics of the portable solar panel satisfies a threshold; and
    displaying a result of the determination on a display of the monitoring device embedded in the portable solar panel.

2. The method of claim 1, wherein the portable solar panel include one or more portable solar panels.

3. The method of claim 1, wherein the I-V characteristics identify energy conversion capability of the portable solar panel at a specified illumination and temperature conditions.

4. The method of claim 3, wherein the result of the determination indicates a solar panel pass status when degradation of the portable solar panel is less than the threshold; and
wherein the result of the determination indicates a solar panel fail status when degradation of the portable solar panel is greater than the threshold.

5. The method of claim 1, wherein identifying the I-V characteristics of the portable solar panel comprises measuring an illuminated I-V or dark I-V curve, the dark I-V being measured in absence of light.

6. The method of claim 1, wherein the portable solar panel is foldable.

7. An apparatus for monitoring performance of a portable solar panel, comprising:
a memory configured to store instructions;
a selectable trigger;
a processor communicatively coupled with the memory and the selectable trigger, the processor configured to execute the instructions to:
detect a selection via the selectable trigger;
identify a current-voltage (I-V) characteristics of the portable solar panel;
determine whether the I-V characteristics of the portable solar panel satisfies a threshold; and
provide a result of the determination on a display of a monitoring device embedded in the portable solar panel.

8. The method of claim 7, wherein the I-V characteristics of the portable solar panel are derived by applying variable loads at a specified illumination level to determine a shape of an I-V curve.

9. The apparatus of claim 7, wherein the portable solar panel include one or more portable solar panels.

10. The apparatus of claim 7, wherein the processor is coupled to a network.

11. The apparatus of claim 7, wherein the portable solar panel is foldable.

* * * * *